United States Patent [19]

Nishio et al.

[11] Patent Number: 4,747,889

[45] Date of Patent: May 31, 1988

[54] INTERCONNECTING WIRE FOR SEMICONDUCTOR DEVICES

[75] Inventors: Masanobu Nishio; Kazuo Sawada; Minoru Yokota; Hitoshi Kishida, all of Osaka, Japan

[73] Assignee: Sumitomo Electric Industries, Ltd., Osaka, Japan

[21] Appl. No.: 865,696

[22] Filed: May 22, 1986

[30] Foreign Application Priority Data

May 22, 1985 [JP] Japan ................................ 60-111118
Jun. 21, 1985 [JP] Japan ................................ 60-136297
Oct. 18, 1985 [JP] Japan ................................ 60-234358

[51] Int. Cl.$^4$ .............................................. C22C 21/00
[52] U.S. Cl. .................................... 148/437; 148/438; 148/439; 148/440; 428/606
[58] Field of Search ........ 420/528, 554, 540, 529–534, 420/536, 537, 541, 542, 546, 548; 148/437–440; 428/606

[56] References Cited

U.S. PATENT DOCUMENTS 3,753,695 8/1973 Lloyd .................................. 420/554

Primary Examiner—R. Dean
Attorney, Agent, or Firm—Sughrue, Mion, Zinn, Macpeak, and Seas

[57] ABSTRACT

An interconnecting wire of aluminum alloy for semiconductor devices which as improved ball-forming performance in the ball-bonding process, without any loss of conductivity and corrosion resistance. There is also provided an interconnecting wire for semiconductor devices which is lowered in resistance, with a minimum loss of conductivity and without any adverse effect on the bonding performance. The interconnecting wire contains about 0.1 to 45 wt % of an element having a melting point lower than about 450° C., with the balance being substantially aluminum, or contains about 0.1 to 45 wt % of one more elements having a melting point lower than about 450° C. and about 0.2 to 2 wt % of one or more elements selected from the group consisting of silicon, magnesium, manganese, and copper, with the balance being substantially aluminum.

4 Claims, No Drawings

INTERCONNECTING WIRE FOR SEMICONDUCTOR DEVICES

FIELD OF THE INVENTION

The present invention relates to an interconnecting wire for semiconductor devices, and more particularly, it relates to an interconnecting wire to be used for ball-bonding.

BACKGROUND OF THE INVENTION

Heretofore, interconnecting wires for semiconductor devices have been comprised of aluminum alloys, e.g., Al-1% alloy. These interconnecting wires are bonded by wedge bonding or ball-bonding. According to the wedge-bonding method, the wire is placed on the part to be connected and then pressed by a wedge with heating or ultrasonic excitation. According to the ball-bonding method, a small ball is formed at the end of a wire by means of an oxygen-hydrogen torch or arc discharge, and the thus-formed ball is pressed against the part to be connected. The ball-bonding method is widely used because of its high efficiency. The interconnecting wires used for ball-bonding is usually a gold wire which is superior in ball-forming performance.

On the other hand, the electrode of an element, e.g., an IC chip, is covered with of aluminum or an aluminum alloy because of its conductivity and ability to bond to the semiconductor. Thus, a connection is established between different metals, namely, aluminum and gold. The aluminum-gold connection tends to become brittle because an intermetallic compound forms during heating in the subsequent process. Therefore, the aluminum-gold connection is less reliable than an aluminum-aluminum connection. In addition, the former is not desirable because of the high price of gold. Under these circumstances, there has long been a strong demand for an interconnecting wire comprising an aluminum alloy which can be used for ball-bonding. The conventional interconnecting wires comprising an aluminum alloy cannot be used for consistent ball-bonding these wires have poor ball-forming performance.

Interconnecting wires used for semiconductor devices are required to have another function. For example, interconnecting wires used for power transistors are required to function as fuses when an excessive current is applied by accident. (Such an excessive current might damage not only the power transistor but also the entire electronic apparatus containing other semiconductor devices.) Unfortunately, conventional interconnecting wires made of aluminum are not readily fused by an excessive current, because their melting point is 660° C. even if they are made of high-purity aluminum. On the other hand, a low-melting metal such as solder is not suitable for use as the interconnecting wire of power transistors because of its low conductivity, poor workability, and insufficient strength. For these reasons, circuits for semiconductors are usually provided with a separate unit that functions as s fuse.

Interconnecting wires for semiconductors may be given the function of a fuse by (1) reducing the wire diameter, (2) increasing the electric resistance, or (3) lowering the melting point. The first method has the disadvantage that the same bonding machine cannot be used for both a wire of reduced diameter and a wire which need not function as a fuse. The second method has the disadvantage that the wire has to have a large diameter to attain the desired conductivity. This poses the same problem as in the first method. As for the third method, no aluminum alloy having a sufficiently low melting point, e.g., about 300° C. has been obtained yet as far as is known although the coexistence curve between solid and liquid of the equilibrium diagram of aluminum is shifted by the addition of various elements as described in, e.g., Hansen; "Metallography Structure and Phase Diagram." *Metal Handbook*, vol. 8.

SUMMARY OF THE INVENTION

An object of the present invention is to provide an interconnecting wire comprising an aluminum alloy for semiconductor devices which exhibits improved ball-forming performance in the ball-bonding process, without any loss of conductivity and corrosion resistance.

Another object of the present invention is to provide an interconnecting wire for semiconductor devices which is lower in resistance than conventional wires, with a minimum loss of conductivity and without any adverse effect on the bonding performances.

The gist of the invention resides in an interconnecting wire for semiconductor devices which comprises about 0.1 to about 45 wt% of an element having a melting point lower than about 450° C., with the balance being substantially aluminum, or an interconnecting wire for semiconductor devices which comprises about 0.1 to about 45 wt% of one or more elements having a melting point lower than about 450° C. and about 0.2 to 2 wt% of one or more elements selected from the group consisting of silicon, magnesium, manganese and copper, with the balance being substantially aluminum.

DETAILED DESCRIPTION OF THE INVENTION

The interconnecting wire of this invention is superior to conventional interconnecting wires comprising an aluminum alloy in ball-forming performance in the ball bonding process. Presumably, this is because this wire comprises about 0.1 to about 45 wt% of an element having a melting point lower than about 450° C. (referred to as a low-melting point element) and the low-melting point element increases the surface tension of the molten ball and forms an oxide film of different properties on the ball surface.

According to this invention, the content of the low-melting point element is limited to approximately 0.1 to about 45 wt%. With less than about 0.1 wt%, very little improvement is seen in the ball-forming performance; with more than about 45 wt%, the wire is poor in workability and mechanical and electrical properties.

When the content of the low-melting point element is more than 10 wt%, the improvement of ball-forming performance reaches a plateau. Therefore, the amount of the low-melting point element in the range of 0.1 to 10 wt% would be sufficient in situations where the ball-forming performance alone is important.

In the case where importance is attached to the wire's function as a fuse, the low-melting point element should preferably have a melting point lower than 350° C. and it should be used in an amount of 1 to 45 wt%.

Examples of the low-melting point element that can be used in this invention include bismuth (Bi; m.p. 272° C.), lead (Pb; m.p. 328° C.), tin (Sn; 232° C.), cadmium (Cd; 321° C.), zinc (Zn; 420° C.), and indium (In; m.p. 157° C.). In the preferred case, the interconnecting wire of this invention further contains about 0.2 to about 2 wt% of one or more elements selected from the group consisting of silicon, magnesium, manganese, and copper. These elements improve the strength of the wire and facilitate the production of ultrafine wires. The content of these elements is limited to approximately 0.2 to approximately 2 wt%. With less than about 0.2 wt%, they do not produce any effect in the improvement of strength and workability. Conversely, with more than about 2 wt%, they decrease the strength of the wire and adversely affect the corrosion resistance and uniformity in the composition of the wire. Where importance is attached to the wire's function as a fuse, the amount of the above-mentioned elements should preferably be 0.5 to 2 wt%.

The interconnecting wire of this invention is superior in bonding performance because it is composed mainly of aluminum. In addition, the interconnecting wire of this invention does not show a decrease in conductivity in spite of the elements added, because they form a solid solution with aluminum in which they are contained in an amount of only 0.5 wt% or less and the balance is present as a simple element dispersed in aluminum. The low-melting point elements added enter a liquid phase at about 330° to about 430° C., permitting the interconnecting wire to easily fuse or break.

The invention is now described in more detail with reference to the following Examples, but is not limited in scope by these Examples.

EXAMPLE 1

Various kinds of alloys were prepared from 99.99% pure aluminum as a basic metal according to the compositions (wt%) as shown in Table 1. After alloy making, the melt was continuously cast into billets through a ceramics filter to remove foreign matter greater than several microns.

After surfacing, the billet was formed into a rod 10 mm in diameter by hot extrusion. The rod was made into a wire 40 micrometers in diameter by scaling, drawing, and heat treatment.

The resulting wire was examined for ball-forming performance and workability as follows:

(1) Ball-forming performance

The sample wire (40 micrometers in diameter) is passed through a sapphire capillary, and the end of the wire having passed through such is positioned near an electrode. An arc discharge is made between the wire end and the electrode in an argon gas stream so that a ball is formed. The formation of the ball is evaluated, and the rating of the results is indicated by "o" or "x", which are defined as:

o: The ball has an almost truly spherical shape and smooth surface.

x: The ball fluctuates in size and has a poor surface. The latitude of ball formation is narrow.

(2) Workability

The workability for wire drawing was examined and the rating of the results is indicated by "o" or "x", which are defined as:

o: As good as conventional wires.

x: Poorer than conventional wires.

TABLE 1

| Run No. | Bi | Pb | Sn | Cd | Zn | In | Si | Mg | Mn | Cu | Al | Ball-forming | Workability |
|---|---|---|---|---|---|---|---|---|---|---|---|---|---|
| 1 | — | 0.5 | — | — | — | — | — | — | — | — | Bal.** | o | o |
| 2 | — | 0.1 | — | — | — | — | 1.0 | — | — | — | Bal. | o | o |
| 3 | — | 0.3 | — | — | — | — | — | 1.5 | — | — | Bal. | o | o |
| 4 | — | 5.0 | — | — | — | — | — | — | 1.0 | 0.3 | Bal. | o | o |
| 5 | — | 2.0 | — | — | — | — | — | — | — | — | Bal. | o | o |
| 6 | 2.5 | — | — | 1.0 | — | — | — | — | — | — | Bal. | o | o |
| 7 | — | — | — | — | 5.0 | — | — | — | — | — | Bal. | o | o |
| 8 | — | 5.0 | 5.0 | — | — | — | — | — | — | — | Bal. | o | o |
| 9 | — | — | 10 | — | — | — | 1.0 | — | — | — | Bal. | o | o |
| 10 | 5.0 | — | — | — | — | — | — | 1.5 | — | — | Bal. | o | o |
| 11 | — | 10 | — | — | — | — | — | — | 1.9 | — | Bal. | o | o |
| 12 | — | — | 0.1 | — | 0.2 | — | — | — | — | 1.7 | Bal. | o | o |
| 13 | 0.5 | — | — | — | — | — | 0.1 | 1.5 | — | — | Bal. | o | o |
| 14 | 0.2 | 0.4 | 0.3 | — | — | — | — | — | 0.9 | — | Bal. | o | o |
| 15 | — | 0.8 | 0.9 | — | — | — | — | 1.0 | — | — | Bal. | o | o |
| 16 | — | 10 | — | — | — | — | 1.0 | — | — | — | Bal. | o | o |
| 17 | — | 30 | — | — | — | — | — | 1.5 | — | — | Bal. | o | o*** |
| 18 | — | 20 | — | — | — | — | — | — | — | — | Bal. | o | o*** |
| 19 | — | — | — | — | — | 10 | — | — | — | — | Bal. | o | o |
| 20* | — | — | — | — | — | — | — | — | — | — | Bal. | x | o |
| 21* | — | — | — | — | — | — | 1.0 | — | — | — | Bal. | x | o |
| 22* | — | 0.01 | — | — | — | — | — | 1.5 | — | — | Bal. | x | o |
| 23* | — | — | — | — | — | — | — | — | 1.0 | 0.3 | Bal. | x | o |
| 24* | — | — | — | — | — | — | — | 1.5 | — | — | Bal. | x | o |
| 25* | — | 15 | — | — | — | — | — | — | — | — | Bal. | o | x |
| 26* | — | 0.01 | 0.03 | — | — | — | — | — | 1.0 | — | Bal. | x | o |
| 27* | — | — | — | — | 20 | — | — | — | — | 1.9 | Bal. | o | x |
| 28* | 0.2 | — | — | 0.3 | — | — | 3.0 | — | — | — | Bal. | o | x |
| 29* | — | 0.02 | — | — | 0.03 | — | — | 5.0 | — | — | Bal. | x | x |
| 30 | — | — | — | — | — | — | 1.0 | — | — | — | Bal. | x | o |

*Comparative examples
**The balance of each composition comprises aluminum.
***Workability decreased slightly but was still acceptable It is noted from Table 1 that the interconnecting wire of this invention is superior to conventional wires in ball-forming performance, without suffering from any decrease in workability.

EXAMPLE 2

An alloy was prepared by adding 1 wt% elemental silicon and 10 wt% of elemental lead to high-purity aluminum. With thorough mixing, the melt was continuously cast into a rod 6 mm in diameter. The rod was drawn into an interconnecting wire 350 micrometers in diameter. The rod was drawn into an interconnecting wire 350 micrometers in diameter. It has a conductivity of about 50% JACS, which is sufficient for an interconnecting wire. The term "IACS" is an abbreviation for International Annealed Copper Standard and indicates degree of conductivity in percentage based on the conductivity of standard soft copper, which has a volume resistivity of 17.241 n$\Omega$·m, being taken as 100%.

This interconnecting wire was connected to the input of a power transistor by ultrasonic bonding. When a current ten times the rating of the wire was applied to the power transistor, the interconnecting wire was instantaneously broken. This protected the nearby wiring from over-currents.

EXAMPLE 3

An Al-Mg-Pb alloy was produced (comprising 1.5% Mg, 30% Pb with the balance Al), with high-purity aluminum as a basic metal. The alloy was made into an ingot 30 mm in diameter. The ingot was broken up into small pieces, which were melted again. The melt was injected through a nozzle having a small hole 200 micrometers in diameter into a cooling liquid in a rotating drum, whereby a wire 200 micrometers in diameter was obtained. This wire was drawn into an interconnecting wire 100 micrometers in diameter. It was used for connection of a power transistor in the same way as in Example 2. When a current eight times the rating of the wire was applied to the power transistor, the interconnecting wire was instantaneously broken.

The interconnecting wire of this invention can be applied not only to power transistors but also to other semiconductor devices (Integrated Circuits and Large Scale Integrated Circuits) which are likely to be subjected to over-currents.

While the invention has been described in detail and with reference to specific embodiments thereof, it will be apparent to one skilled in the art that various changes and modifications can be made therein without departing from the spirit and scope thereof.

What is claimed is:

1. An interconnecting wire for semiconductor devices consisting essentially of about 0.1 to about 45 wt% of an element having a melting point lower than about 450° C. selected from the group consisting essentially of lead, tin, cadmium, zinc and indium, with the balance being substantially aluminum, said wire having a diameter of from 40 to 350 $\mu$m.

2. An interconnecting wire for semiconductor devices as in claim 1 which further comprises about 0.2 to about 2 wt% of one or more elements selected from the group consisting of silicon, magnesium, manganese, and copper.

3. An interconnecting wire for semiconductor devices consisting essentially of 1 to 45 wt% of an element having a melting point lower than 350° C. selected from the group consisting of lead and indium, with the balance being substantially aluminum, said wire having a diameter of from 40 to 350 $\mu$m.

4. An interconnecting wire for semiconductor devices as in claim 3, which further comprises about 0.5 to about 2 wt% of one or more elements selected from the group consisting of silicon, magnesium, manganese, and copper.

* * * * *